: US008804331B2

(12) United States Patent
Refai-Ahmed

(10) Patent No.: US 8,804,331 B2
(45) Date of Patent: Aug. 12, 2014

(54) PORTABLE COMPUTING DEVICE WITH THERMAL MANAGEMENT

(75) Inventor: Gamal Refai-Ahmed, Markham (CA)

(73) Assignee: ATI Technologies ULC, Markham (CA)

( * ) Notice: Subject to any disclaimer, the term of this patent is extended or adjusted under 35 U.S.C. 154(b) by 228 days.

(21) Appl. No.: 13/310,372

(22) Filed: Dec. 2, 2011

(65) Prior Publication Data

US 2013/0141866 A1     Jun. 6, 2013

(51) Int. Cl.
*H05K 7/20*     (2006.01)

(52) U.S. Cl.
USPC ............. 361/679.54; 361/679.55; 361/704; 361/710; 165/80.2; 165/104.33

(58) Field of Classification Search
USPC ............. 361/679.54, 679.55, 690–692, 704, 361/707, 710, 714; 174/50, 50.52, 520, 174/35 R, 35 MS; 312/223.2, 223.3, 236; 165/80.3, 104.33, 185
See application file for complete search history.

(56) References Cited

U.S. PATENT DOCUMENTS

| | | | | |
|---|---|---|---|---|
| 5,313,362 | A * | 5/1994 | Hatada et al. | 361/709 |
| 6,205,025 | B1 * | 3/2001 | Chen | 361/704 |
| 6,384,331 | B1 * | 5/2002 | Ku | 174/548 |
| 6,442,025 | B2 * | 8/2002 | Nakamura et al. | 361/695 |
| 6,570,086 | B1 * | 5/2003 | Shimoji et al. | 174/377 |
| 6,819,559 | B1 * | 11/2004 | Seeger et al. | 361/679.46 |
| 6,859,364 | B2 * | 2/2005 | Yuasa et al. | 361/679.54 |
| 6,980,418 | B1 * | 12/2005 | Seeger et al. | 361/679.54 |
| 7,623,349 | B2 | 11/2009 | Refai-Ahmed et al. | |
| 8,189,331 | B2 * | 5/2012 | Senatori | 361/679.48 |
| 8,379,383 | B2 * | 2/2013 | Sugiura et al. | 361/679.47 |
| 8,526,179 | B2 * | 9/2013 | Tracy et al. | 361/679.55 |
| 2008/0158817 | A1 * | 7/2008 | Tsunoda et al. | 361/697 |
| 2013/0050943 | A1 * | 2/2013 | Diep et al. | 361/702 |

* cited by examiner

*Primary Examiner* — Michail V Datskovskiy
(74) *Attorney, Agent, or Firm* — Timothy M. Honeycutt

(57) ABSTRACT

Various computing devices and methods of thermally managing the same are disclosed. In one aspect, a method of thermally managing a computing device is provided where the computing device includes a housing that has a wall adapted to contact a body part of a user, a circuit board in the housing, and a semiconductor chip coupled to the circuit board. The method includes placing a first heat spreader in thermal contact with the semiconductor chip and the circuit board but separated from the wall by a gap.

19 Claims, 3 Drawing Sheets

PORTABLE COMPUTING DEVICE WITH THERMAL MANAGEMENT

BACKGROUND OF THE INVENTION

1. Field of the Invention

This invention relates generally to electronic devices, and more particularly to heat spreaders for providing thermal management of electronic devices, including semiconductor chips.

2. Description of the Related Art

Handheld computing devices, such as smart phones, tablet computers and e-book readers, present significant thermal management challenges. There is ongoing user demand for devices that are not only smaller form factor for greater portability but also powerful enough to handle video and other computing intensive tasks. The provision for significant computing power in a relatively small form device often translates into the need for significant thermal management of the heat dissipating devices.

One common solution used to transfer heat from a processor in a small form device includes the use of a heat spreader that is in thermal contact with the processor. The heat spreader is in turn, in thermal contact with a heat exchanger via a heat pipe or other structure. The heat exchanger often includes an air mover such as a fan. One example of such a conventional device is the model LE1700 manufactured by Motion Computing, Inc. The LE1700 includes a very thin fan connected thermally to a heat spreader mounted to the microprocessor and by way of a heat pipe. The fan vents air to the external ambient by way of a small vent. An Acer model Iconia is another conventional example.

Even with the conventional thermal management system just described in place, hot spots on the surface of the computing device that contact the user can arise due to direct conductive thermal pathways between heat dissipating components inside the device and the exterior wall of the device housing. Not only does a typical handheld microprocessor dissipate heat, but other components as well, such as hard drives, power supply units, batteries and others. Indeed, the problem of heat dissipation is often exacerbated during times when the computing device is connected to an external AC power source to recharge the battery.

Another potential pitfall associated with the conventional thermal management system just described is the issue of both acoustic and electrical noise associated with a cooling fan. Such issues can be reduced though not completely eliminated through the use of appropriate noise filtering circuitry and fan and vent design. However, there remains the issue of power consumption to run the fan.

The present invention is directed to overcoming or reducing the effects of one or more of the foregoing disadvantages.

SUMMARY OF EMBODIMENTS OF THE INVENTION

In accordance with one aspect of an embodiment of the present invention, a method of thermally managing a computing device is provided where the computing device includes a housing that has a wall adapted to contact a body part of a user, a circuit board in the housing, and a semiconductor chip coupled to the circuit board. The method includes placing a first heat spreader in thermal contact with the semiconductor chip and the circuit board but separated from the wall by a gap.

In accordance with another aspect of an embodiment of the present invention, a method of manufacturing includes providing a housing that has a wall adapted to contact a body part of a user. A circuit board is placed in the housing. The circuit board has a semiconductor chip coupled thereto. A first heat spreader is placed in thermal contact with the semiconductor chip and the circuit board but separated from the wall by a gap.

In accordance with another aspect of an embodiment of the present invention, a computing device is provided that includes a housing that has a wall adapted to contact a body part of a user and a circuit board in the housing. A semiconductor chip is coupled to the circuit board. A first heat spreader in thermal contact with the semiconductor chip and the circuit board but separated from the wall by a gap.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a computing device are disclosed. In one arrangement, a computing device, such as a tablet computer, includes a housing with an internal space holding a circuit board and semiconductor chip. The housing has an external wall. A heat spreader is in thermal contact with the semiconductor chip, but separated from the wall by a gap. The gap eliminates a direct thermal pathway to a body part of a user that would otherwise exist. Additional details will now be described.

Figure 1:
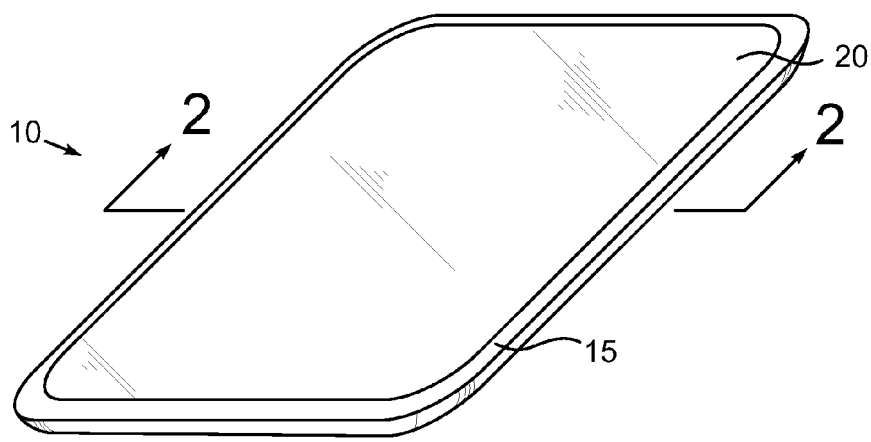
FIG. 1 is a pictorial view of an exemplary embodiment of a computing device.

In the drawings described below, reference numerals are generally repeated where identical elements appear in more than one figure. Turning now to the drawings, and in particular to FIG. 1, therein is shown a pictorial view of an exemplary embodiment of a computing device 10. The computing device 10 may be any of a number of different types of computing devices, such as hand held computers, smart phones, or virtually any other portable computing device. In this illustrative embodiment, the computing device 10 may include a housing 15 and a screen or display 20 connected to the housing 15. Here the housing 15 and the screen 20 have a generally rectangular shape with rounded corners. However, the skilled artisan will appreciate that the footprints of the housing 15 and the display 20 may take on virtually limitless numbers of configurations. The housing 15 may be constructed of well-known plastics, metals, such as aluminum, stainless steel or the like, or combinations of such materials. The display 20 may be a liquid crystal display, a LED readout or virtually any other type of display device.

Figure 2:
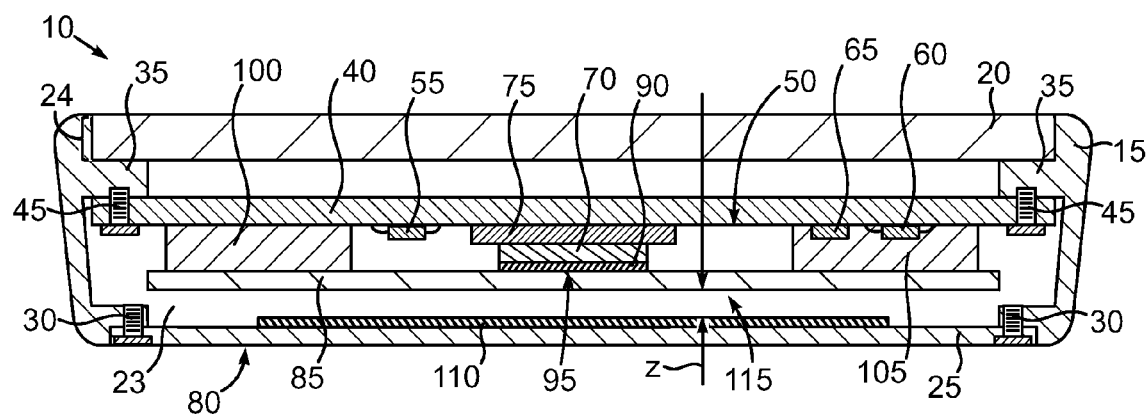
FIG. 2 is a sectional view of FIG. 1 taken at section 2-2.

Additional details of the computing device 10 may be understood by referring now also to FIG. 2, which is a sectional view of FIG. 1 taken at section 2-2. In this illustrative embodiment, the housing 15 includes an internal space 23 for holding various components. The housing 15 may include a front opening 24 to accommodate the display 20 (represented schematically for simplicity of illustration) and an exterior wall 25 designed to contact a body part (a hand, arm or lap) of a user. The exterior wall 25 may include a removable back panel 27 that provides access to the internal space 23 and the components positioned therein. The back panel 27 may be secured to the housing 15 by way of one or more screws 30 or other types of fasteners. Optionally, the exterior wall 25 may be fixed and access to the internal space 23 provided via the opening 24. To provide a seating area for the display 20, the housing 15 may include a peripheral shelf 35 that circumscribes the opening 24. A circuit board 40 is positioned in the internal space 23 and may be secured to an underside of the peripheral shelf 35 by way of one or more screws 45 or other fasteners. The circuit board 40 may be a system board, a daughter board or other type of printed circuit board and composed of a variety of materials, such as well-known ceramics, organic materials such as one or more epoxy layers or other materials. The circuit board 40 includes plural surface and/or internal conductor traces (not visible) interconnected by vias as desired. Depending on the complexity of the computing device 10, the circuit board 40 may be populated by numerous components. A few exemplary components that are surface-mounted to the side 50 of the circuit board 40, such as the resistors 55 and 60 and a capacitor 65, are depicted. The skilled artisan will appreciate that many different types of components may be mounted to the circuit board 40.

A semiconductor chip 70 may be electrically connected and mounted to the circuit board 40 by way of another circuit board 75. The semiconductor chip 70 may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The semiconductor chip 70 may be constructed of bulk semiconductor, such as silicon or germanium, or semiconductor-on-insulator materials, such as silicon-on-insulator materials. The circuit board 75 may be a semiconductor chip package substrate or virtually any other type of printed circuit board. Structurally speaking, the circuit board substrate 75 may use the same types of structures and materials as the circuit board 40. The circuit board 75 may be connected to the circuit board 40 by a ball grid array, a land grid array, a compression fit or virtually any other type of interconnect structure.

The outer surface 80 of the back panel 27 may be in frequent and sometimes long term contact with various parts of a user's body. Accordingly, this illustrative embodiment includes a thermal management system that is designed to keep the temperature of the outer surface 80 of the back panel 27 within comfortable limits but without necessarily having to resort to a fan for heat transfer. Here, a heat spreader 85 is placed in thermal contact with the semiconductor chip 70 by way of a thermal interface material (TIM) 90. The heat spreader 85 is advantageously fabricated as a sheet with a relatively large surface area compared to the size of the semiconductor chip 70, and from a variety of thermally conducting materials, such as copper, aluminum, stainless steel, nickel, laminates of these or other like materials. The thermal interface material 90 may be composed of a variety of TIM materials, such as silicone-based greases or gels, phase change materials or others, and with or without thermally conducting fillers, such as silver or nanoparticles. Examples includes Shinetzu 750 and Laird 780SP. However, the thermal interface material 90 is selected to have a less than perfectly optimal thermal conductivity. A goal is to provide enough thermal resistance between the heat spreader 85 and the semiconductor chip 70 so that the junction temperature of the semiconductor chip 70 remains below damaging levels, yet high enough that heat is transferred from the semiconductor chip 70 to the heat spreader 85 somewhat slowly. In this way, heat does not simply pass quickly and concentrate at the center portion 95 of the heat spreader 85 that is proximate the semiconductor chip 70, but instead spreads laterally across the extent of the heat spreader 85. In addition, the heat spreader 85 may be placed directly in thermal contact with the circuit board 40 at one point or another. This may be accomplished by, for example, placing a thermal pad 100 in contact with both the circuit board 40 and the heat spreader 85 and another thermal pad 105 similarly positioned, albeit, on the opposite side between the circuit board 40 and the heat spreader 85. The thermal pads 100 and 105 may be composed of relatively compliant heat transfer materials such as TFlex 740 or 340 from Laird or dispensable polymeric materials such as T630 from Chomerics. Because the thermal pads 100 and 105 are both electrically insulating and relatively compliant, they may even be positioned over components that are mounted on the circuit board 40, such as, for example, the components 60 and 65. In this way, heat is transferred not only from the semiconductor chip 70 but also from heat generating components that may be present on the surface 50 of the circuit board 40. Note that the heat spreader 85 may be held in place by the inherent tackiness of the TIM 90 and the thermal pads 100 and 105. However, fasteners (not shown) may be used to secure the heat spreader 85.

The inner surface of the back panel 27 may be fitted with a thin heat spreader 110 that may be configured as a sheet like the heat spreader 85, but with a smaller thickness and perhaps a smaller overall footprint depending upon the size of the back panel 27. The heat spreader 110 is advantageously fabricated such as copper, aluminum, stainless steel, nickel, laminates of these or other like materials. The heat spreader 85 is deliberately separated from the back panel 27, and in this case the heat spreader 110, by a gap 115 with a thickness z. The gap 115 provides an airspace to facilitate heat transfer from the heat spreader 85 via both natural convection of air in the gap 115, and radiative transfer to the heat spreader 110. In addition, the gap 115 eliminates the possibility of direct thermal contact between any hot spots of the heat spreader 85 and the body of the user. Experiment has shown that the temperature $T_{skin}$ of the outer surface 80 of the back panel 27 is inversely proportional to the size z of the gap 115. Thus, by decreasing the width z of the gap 115, the temperature $T_{skin}$ may be held at levels that are comfortable for the user. One rule of thumb that may be useful for hand or lap-positioned devices is that the $T_{skin}$ should be approximately 25° C.±17° C. Assuming for the sake of this discussion that the temperature $T_{core}$ of the semiconductor chip 70 should be less than or equal to 65° C., an air gap 115 of less than a millimeter may be appropriate.

Figure 3:
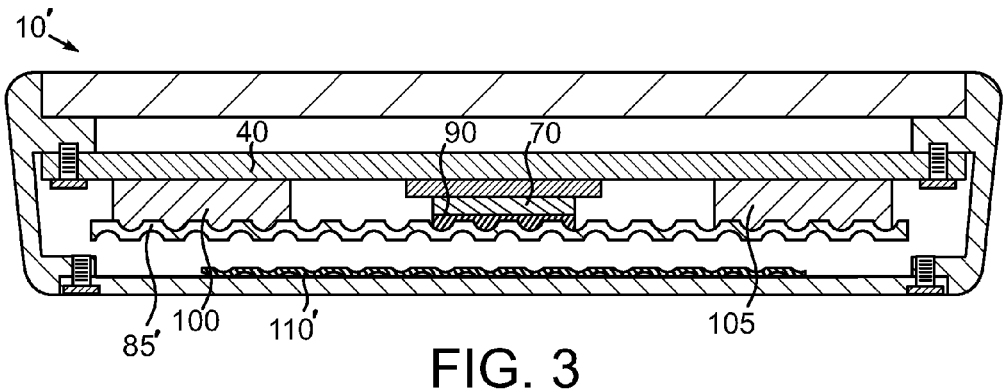
FIG. 3 is a sectional view like FIG. 2, but of an alternate exemplary embodiment of a computing device.
Figure 4:
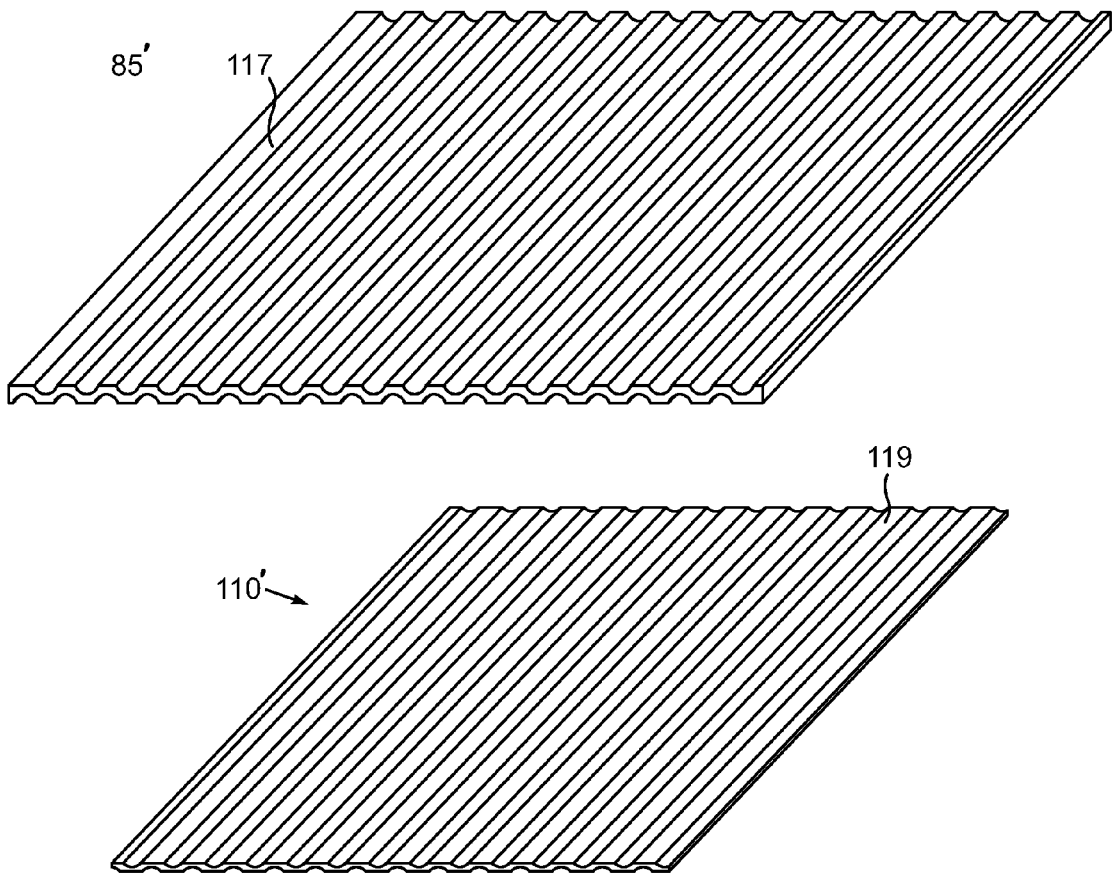
FIG. 4 is a pictorial view of a pair of exemplary heat spreaders.

The thermal performance of the heat spreaders 85 and 110 depicted in FIG. 2 may be improved by increasing the surface area thereof. FIG. 3 is a sectional view like FIG. 2, but of an alternate exemplary embodiment of the computing device 10' that includes heat spreaders 85' and 110' fitted with texture surfaces and FIG. 4 is a pictorial view of the heat spreaders 85' and 110' removed from the computing device 10'. The computing device 10' may be substantially identical to the computing device 10 depicted in FIGS. 1 and 2. However, the heat spreaders 85' and 110' may be provided with textured, in this case corrugated, surfaces 117 and 119, respectively. The heat spreader 85' is in thermal contact with the semiconductor chip 70 by way of the thermal interface material 90 as described above. In addition, the thermal pads 100 and 105 may be used to establish thermal contact between the circuit board 40 and the heat spreader 85'. The heat spreader 85' and the heat spreader 110' are separated by the aforementioned gap 115 with the desired size z. It should be understood that the heat spreaders 85' and 110' may be the rectangular sheets with the corrugated surfaces as disclosed. However, the skilled artisan will appreciate that the heat spreaders 85' and 110' as well as the alternatives thereof disclosed herein may take on other than rectangular sheet footprints. Note that the corrugated surfaces 117 and 119 may be provided by stamping, machining, casting or other material fashioning techniques. Note also that other topographies may be used to increase the surface areas of the heat spreaders 85' and 110', such as establishing dimples, mounds or the like.

Figure 5:
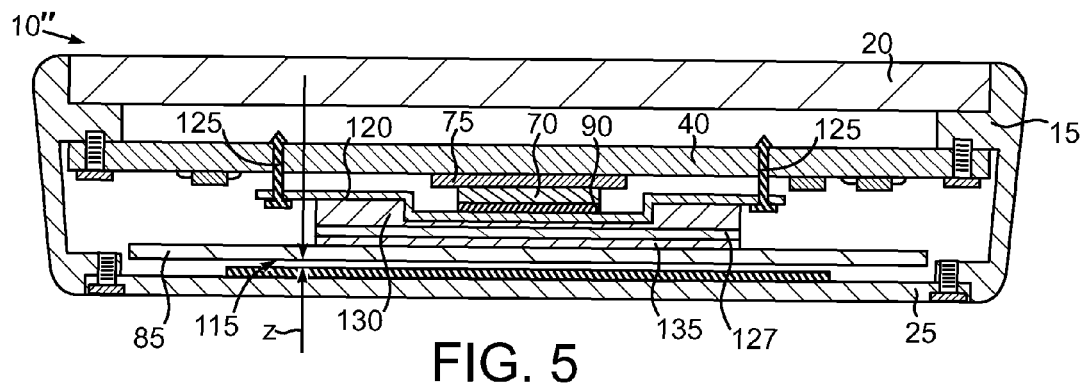
FIG. 5 is a sectional view like FIG. 2, but of another alternate exemplary embodiment of a computing device.
Figure 6:
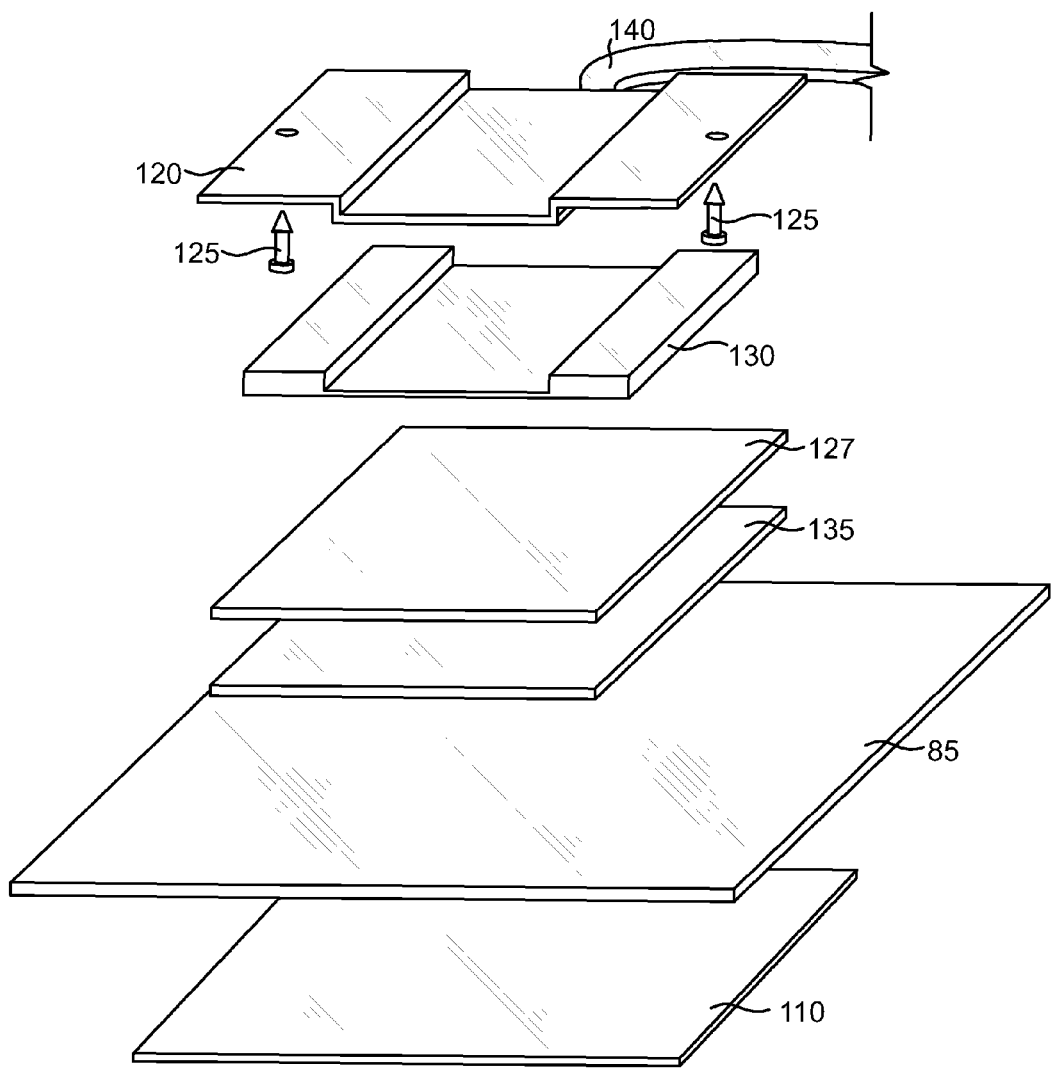
FIG. 6 is an exploded pictorial view of components of an exemplary thermal management system for the computing device of FIG. 5.

Another alternate exemplary embodiment of a computing device 10" may be understood by referring now to FIGS. 5 and 6. FIG. 5 is a sectional view of the computing device 10" and FIG. 6 is an exploded pictorial view of components of the thermal management system for the computing device 10". Like the other illustrative embodiments, the computing device 10" may include the housing 15, the display 20, the back panel 27, the circuit board 40 and the semiconductor chip 70 mounted thereon by way of the circuit board 75. Here, however, a technical goal is to retrofit an existing thermal management system of the computing device 10" with elements of the heat transfer schemes illustrated in FIG. 2 or 3. The computing device 10" includes a native heat spreader 120 in thermal contact with the semiconductor chip 70 by way of the TIM 90. The term "native" implies that the heat spreader 120 is fundamentally designed at the outset work without supplementary thermal management in mind. The native heat spreader 120 may be secured to the circuit board 40 by way of one or more rivets 125, although other types of fasteners, such as screws or others may be used in lieu of the rivets 125. In addition, the computing device 10" includes an electromagnetic interference (EMI) shield 127 that would ordinarily be seated on the native heat spreader 120. Since the computing device 10" includes the native heat spreader 120 and the EMI shield 127, the aforementioned additional heat spreaders utilizing a gap 115 with a selected dimension may be retrofitted to the computing device 10" as follows. A thermal pad 130 may be positioned between the EMI shield 127 and the heat spreader 120. The thermal pad 130 may be composed of the same types of materials disclosed elsewhere herein for the other thermal pads 100 and 105. The EMI shield 127 may be composed of aluminum, copper, stainless steel or other materials suitable to provide EMI shielding. Another thermal pad 135 is positioned on the EMI shield 127 and the heat spreader 85 is positioned on the thermal pad 135. The thermal pad 135 may be composed of the same types of materials disclosed elsewhere herein for the thermal pads 100 and 105. Finally, the heat spreader 110 may be positioned on the back panel 27. In this way, the heat spreader 85 is in thermal contact with the semiconductor chip 70 by way of the path through the TIM 90, the native heat spreader 120, the thermal pad 130, the EMI shield 127 and the thermal pad 135. Again, a gap 115 is advantageously provided with the value z to spread heat as disclosed elsewhere herein. The native heat spreader 120 may consist of the contoured sheet design depicted in FIGS. 4 and 5 alone or may be fitted with one or more heat pipes, one of which is visible and labeled 140. If the heat pipe 140 is connected to a fan (now shown), then the retrofitting or otherwise provisioning of the heat spreaders 85 and 110 may enable the user or manufacturer to deactivate any active cooling devices, such as a fan.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of thermally managing a computing device including a housing having a wall adapted to contact a body part of a user, a circuit board in the housing, and a semiconductor chip coupled to the circuit board, comprising:
   placing a first heat spreader in thermal contact with the semiconductor chip and the circuit board, the first heat spreader being separated from the wall by a gap and not contacting the wall; and
   coupling a second heat spreader to the wall and separated from the first heat spreader by the gap.

2. The method of claim 1, wherein the wall comprises a removable panel.

3. The method of claim 1, wherein the first heat spreader comprises a textured surface facing the wall.

4. The method of claim 1, wherein the second heat spreader comprises a textured surface facing the first heat spreader.

5. The method of claim 1, comprising placing at least one thermal pad in contact with the circuit board and the first heat spreader.

6. The method of claim 1, comprising coupling a third heat spreader between the semiconductor chip and the first heat spreader.

7. The method of claim 1, comprising coupling an EMI shield between the semiconductor chip and the wall.

8. A method of manufacturing, comprising:
   providing a housing having a wall adapted to contact a body part of a user;
   placing a circuit board in the housing, the circuit board having a semiconductor chip coupled thereto;
   placing a first heat spreader in thermal contact with the semiconductor chip and the circuit board, the first heat spreader being separated from the wall by a gap and not contacting the wall; and
   coupling a second heat spreader to the wall and separated from the first heat spreader by the gap.

9. The method of claim 8, wherein the first heat spreader comprises a textured surface facing the wall.

10. The method of claim 8, wherein the second heat spreader comprises a textured surface facing the first heat spreader.

11. The method of claim 8, comprising placing at least one thermal pad in contact with the circuit board and the first heat spreader.

12. The method of claim 8, comprising coupling a third heat spreader between the semiconductor chip and the first heat spreader.

13. A computing device, comprising:
   a housing having a wall adapted to contact a body part of a user;
   a circuit board in the housing;
   a semiconductor chip coupled to the circuit board;

a first heat spreader in thermal contact with the semiconductor chip and the circuit board, the first heat spreader being separated from the wall by a gap and not contacting the wall and a second heat spreader coupled to the wall and separated from the first heat spreader by the gap.

14. The computing device of claim 13 wherein the wall comprises a removable panel.

15. The computing device of claim 13, wherein the first heat spreader comprises a textured surface facing the wall.

16. The computing device of claim 13, wherein the second heat spreader comprises a textured surface facing the first heat spreader.

17. The computing device of claim 13, comprising at least one thermal pad contacting the circuit board and the first heat spreader.

18. The computing device of claim 13, comprising a third heat spreader between the semiconductor chip and the first heat spreader.

19. The computing device of claim 13, comprising an EMI shield positioned between the semiconductor chip and the wall.

\* \* \* \* \*